US006466672B1

(12) United States Patent
Steers

(10) Patent No.: US 6,466,672 B1
(45) Date of Patent: Oct. 15, 2002

(54) AUDIO SIGNAL CONTROL SYSTEM AND METHOD THEREFOR

(75) Inventor: Hugh Steers, London (GB)

(73) Assignee: Tektronix, Inc., Beaverton, OR (US)

( * ) Notice: Subject to any disclaimer, the term of this patent is extended or adjusted under 35 U.S.C. 154(b) by 693 days.

(21) Appl. No.: 08/833,274

(22) Filed: Apr. 4, 1997

(51) Int. Cl.[7] .................................................. H03G 3/00
(52) U.S. Cl. .......................................... 381/61; 381/119
(58) Field of Search ............................ 381/119, 61, 63; 386/106, 97, 52

(56) References Cited

U.S. PATENT DOCUMENTS 4,675,755 A * 6/1987 Baumeister et al. .......... 386/52
5,497,241 A * 3/1996 Ostrover et al. .............. 386/97
5,712,950 A * 1/1998 Cookson et al. ............ 386/106

* cited by examiner

*Primary Examiner*—Ping Lee
(74) *Attorney, Agent, or Firm*—Francis I. Gray

(57) ABSTRACT

An audio signal control system has a fader control, a memory store, a CPU controlling operation of the memory store and outputting signals to a digital signal processor and thence, via a DAC to a speaker. The invention produces plural sequences of control parameters indicative of the position of the fader and an identifier code representative of each sequence is stored in memory to produce a first version. When a user modifies the position of the fader so a sequence or sequences are modified and a second version of identifier code for the sequences is produced comprising the first version plus the modified sequence. With such a procedure, it is possible for a user to undo/redo versions of the fader control positions and thereby manipulate an audio signal.

2 Claims, 3 Drawing Sheets

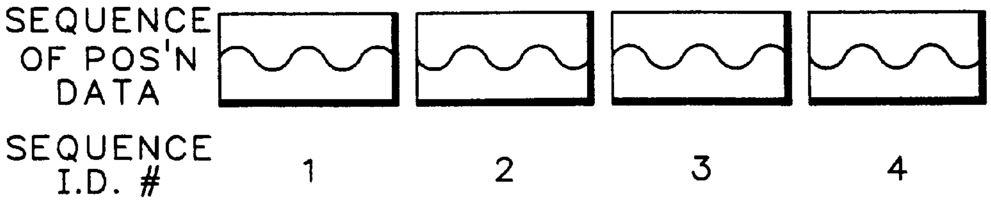
FIG.3(a)
VERSION 1 ( 1, 2, 3, 4,)
FIG.3(b)
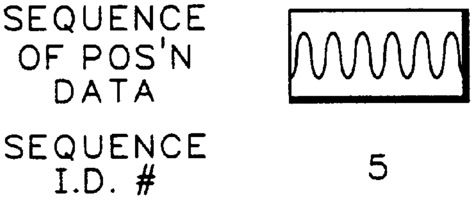
FIG.3(c)
VERSION 2 ( 1, 5, 3, 4, )
FIG.3(d)
FIG.3(e)
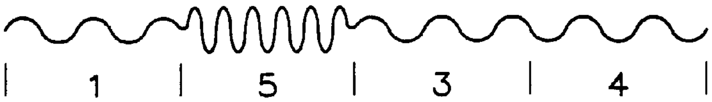
FIG.3(f)

AUDIO SIGNAL CONTROL SYSTEM AND METHOD THEREFOR

CROSS-REFERENCE TO RELATED APPLICATIONS

Not applicable

STATEMENT REGARDING FEDERALLY SPONSORED RESEARCH OR DEVELOPMENT

Not applicable

BACKGROUND OF THE INVENTION

This invention relates to an audio signal control system and to a method of operating an audio signal control system.

When an audio engineer mixes several audio tracks together to form a final production version, the level of each channel for each track of the mix is varied throughout the production on a digital mixing console. Thus an audio signal is recorded via plural channels onto several audio tracks and each one of the audio tracks may be subsequently modified by an audio engineer. The modified audio signal is stored so that the final production audio signal is usually a result of several prior versions of the audio signal having been modified. In the digital mixing console each of the audio signal levels is defined by plural sequences of numeric values generated using a fader control coupled to an analog to digital converter (ADC).

The numeric values are stored and the levels are subsequently used by a digital signal processor (DSP) in conjunction with the associated digital audio samples in a mixing calculation, the result of which is converted to an analog signal in a digital to analog converter (DAC) and subsequently aurally played on a speaker.

Known audio production equipment may record the sequences of numeric values generated from the fader controls and store the sequences in memory, such as a disk drive.

When replaying the audio signal, the fader controls are moved approximately in synchronism in dependence upon the sequences stored in memory so that the fader controls mimic their original positions. When an audio engineer wishes to modify a track of the audio signal, the appropriate fader control is moved to a new position and when the audio engineer is satisfied that the new position is correct then the new sequence of numeric values for the fader control is stored.

In the known equipment, in the step of storing the new version of the fader control numeric position, the previous version is overwritten.

The present invention seeks to provide an apparatus and a method in which current and previous versions of the numeric values generated by the fader control are stored so that an audio engineer may revert back to a previous version, if desired.

BRIEF SUMMARY OF THE INVENTION

According to a first aspect of this invention there is provided an audio signal control system including means for determining plural sequences of a control parameter for generating an audio signal to produce a first version, means for storing said plural sequences of said control parameter, means for modifying said audio signal, and means for determining and storing only the sequence or sequences of said control parameter that were modified in modifying said audio signal, and means for reassembling said control parameter from said sequences derived from various versions of said sequence or sequences.

In a preferred embodiment, the means for modifying said audio signal produces a modified sequence or sequences of said control parameter to produce a further version of said sequence or sequences and means are provided for assembling the originally stored version of sequences altered by said modified sequence or sequences, whereby said original and said further version are stored by said storing means.

Preferably said means for storing is arranged to store N versions of said sequences and conveniently N may be equal to 10.

In a feature of this invention there is provided an audio signal control system including means for generating an audio signal connected to means for storing a control parameter associated with said audio signal, means for modifying said stored audio signal and at least a portion of said control parameter, said control parameter being divided into plural sequences and said portion being a sequence or sequences of said control parameter, means for storing at least one sequence of said control parameter that is modified by said modifing means whereby said means for storing stores said original control parameter and said modified control parameter.

Preferably the control parameter is produced by a position control means such as a slider control or a rotary control.

Advantageously means are provided for replaying said stored audio signal in dependence upon a desired serial sequence of said control parameter stored in different versions thereof, and said means may conveniently comprise a digital signal processor receiving signals from said storage means and outputting signals via a digital to analog converter to an audio speaker.

According to a further aspect of this invention there is provided an audio signal control method including the steps of determining plural sequences of a control parameter for generating an audio signal to produce a first version, storing said plural sequences of said control parameter as said first version, and when modifying said audio signal, determining and storing only the sequence or sequences that were modified to produce a second version whereby both said first version and said second version are stored for subsequent recall, and assembling said control parameter from said sequences derived from said first version and said second version for utilisation.

In a currently preferred embodiment, the modified sequence or sequences produce a second version comprising said first version of sequences altered by said modified sequence or sequences whereby both said first version and said second version formed by said first version modified by said altered sequence or sequences are stored in their entirety. In another embodiment the modified sequence or sequences is stored by storing the change in parameter of the modified sequence or sequences rather than the actual modified sequence or sequences. In a further embodiment, only the modified sequence is stored with an appropriate address.

Preferably N versions may be stored and conveniently N may be equal to 10.

Advantageously each said sequence has a predetermined length, of for example 4096 bytes.

Preferably each sequence comprises parametric control data and a unique identifier code, which identifier code may be for example a numerical code. A version typically may comprise plural sequences plus associated identifier codes.

Conveniently, a predetermined sampling rate of for example 50 Hz is used to determine the location of the sequence or sequences that are modified in a series string of such sequences.

It will be understood from the above that the system and method of this invention in the preferred embodiment stores control parameters associated with an audio signal in a sequence of numbers so that a version of said control parameters may be stored. When the control parameter is changed to change the audio signal, the particular number of the sequence or sequences that is modified replaces the originally stored sequence (version) so that both original and modified versions of sequences are stored for subsequent use.

BRIEF DESCRIPTION OF THE SEVERAL VIEWS OF THE DRAWING

The invention will now be described by way of example with reference to the accompanying drawings in which:

FIG. 3 shows in schematic form the manner by which numeric control data is split into blocks of data, each defining a sequence to produce plural versions of the control data.

DETAILED DESCRIPTION OF THE INVENTION

Figure 1:
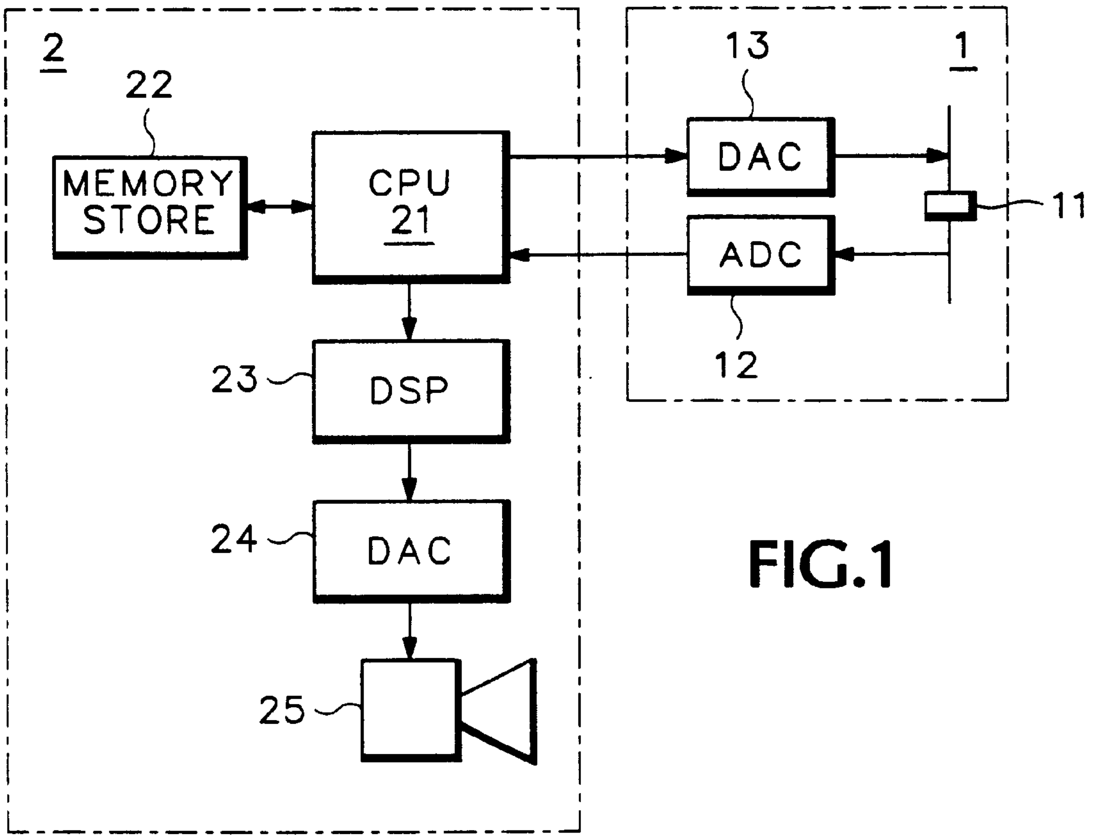
FIG. 1 shows a block schematic diagram of an audio signal control system in accordance with this invention.

The audio signal control system shown in FIG. 1 has a mixing console 1 connected to a computer system 2. The mixing console is a digital device for manipulating and recording an audio signal. In the embodiment shown, the audio signal is modified by a slider, fader control 11 although it is to be understood that the mixing console may with modifications known per se alternatively use rotary controls or pushbuttons (not shown). Further, the mixing console shown in FIG. 1 depicts only a single fader control whereas in practice there will be plural fader controls 11. The fader control 11 generates a control parameter indicative of the position of the fader control 11 along its movement track. The positional control parameter is an analogue signal which is converted to a digital signal by an analogue to digital converter 12 (ADC) which provides an output signal to a CPU 21. The CPU 21 has a memory 22 which may be in the form of a disk store. The memory 22 is used to store both the control parameter indicative of the position of the fader control 11 and the audio signal that is produced as a result of manipulation of the fader control 11. So as to play back the audio signal from the memory 22, the CPU 21 is connected to a digital signal processor (DSP) 23 which provides output via a digital to analog converter (DAC) 24 to an audio speaker 25. When replaying the audio signal the CPU provides output signals to a DAC 13 which controls the position of the fader control 11. In this respect the fader control 11 is usually motorized so that when the audio signal is being replayed the position of the fader control 11 mimics its original position when the audio signal was recorded. An audio engineer may modify the position of the fader control 11 so as to modify the positional control parameters that were originally recorded.

The control parameter of the fader control 11 that is stored is directly indicative of the audio signal that is recorded since the control parameter is derived from the position of the fader control along its track. The first version that is recorded of the control parameter (and hence the audio signal) is herein termed version 1. A modified version of the control parameter is herein termed version 2 and it is to be understood that plural modified versions may be recorded although for convenience it is expected that only about 10 versions will be stored, but such a number is not intended to be limitative.

Thus the control parameters that are stored may be representative for example of control of audio gain, filtering, panning (i.e. left, right channel signal control for stereo and/or front, back channel control for quad) and muting. In this invention the control parameter is divided into plural sequences of blocks of data so that subsequent editing of a sequence or sequences results in an isolated change that is stored.

Figure 2:
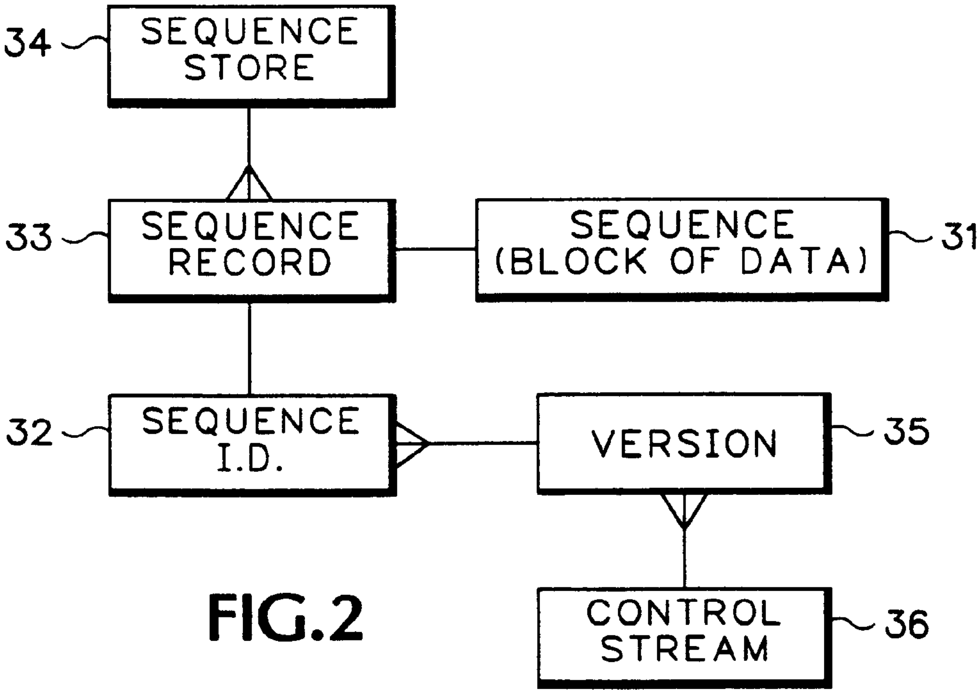
FIG. 2 shows an entity relationship diagram in accordance with this invention.

The entity relationship diagram shown in FIG. 2 shows a sequence or block of recorded parametric control data 31. The block of data has a fixed storage size of, for example, 4096 bytes. Each sequence has a sequence identifier code 32 which may be simply a number, for example, 1, 107, or 563419. The sequence of the data together with the sequence identifier code is combined to form a sequence record 33 which is stored in a sequence store 34 which is a set of sequence records.

A version 35 is produced by a list of version identifier codes, e.g. 1, 107 or 563419. A control stream 36 is a set of versions. Thus a control stream is a set of versions, one of which is the current, i.e. latest, version and each version is a list of sequence identifier codes. The identifier codes determine a sequence, i.e. block of control data.

Therefore, playing an audio signal is performed by considering the version to be played which uses the steps of looking up the record corresponding to identifier codes listed in the version and using the block of data in the sequence to adjust the position of the control fader 11. The sequences, i.e. blocks of data, are played back one by one.

At any point on a subsequent replay of the audio signal, the audio engineer may override the stored value from a sequence with a new value derived by the engineer moving the fader control 11 to a new position. When the audio engineer is satisfied that it is at a desired position, the engineer causes the new position to be stored.

Thus, during replay of a current version and the control fader 11 position is altered, a new version of the control parameter is created. This version is a copy of the previous version but with a new sequence identifier code substituted in place of the sequence identifier code whose sequence, i.e. data block, was changed. The sequence identifier code therefore identifies the new block whose data contains the changed value. The original block remains unchanged as the version 1 and the modified version is then version 2. Subsequent changes throughout the same session are all part of the same (modified) version.

Figure 4:
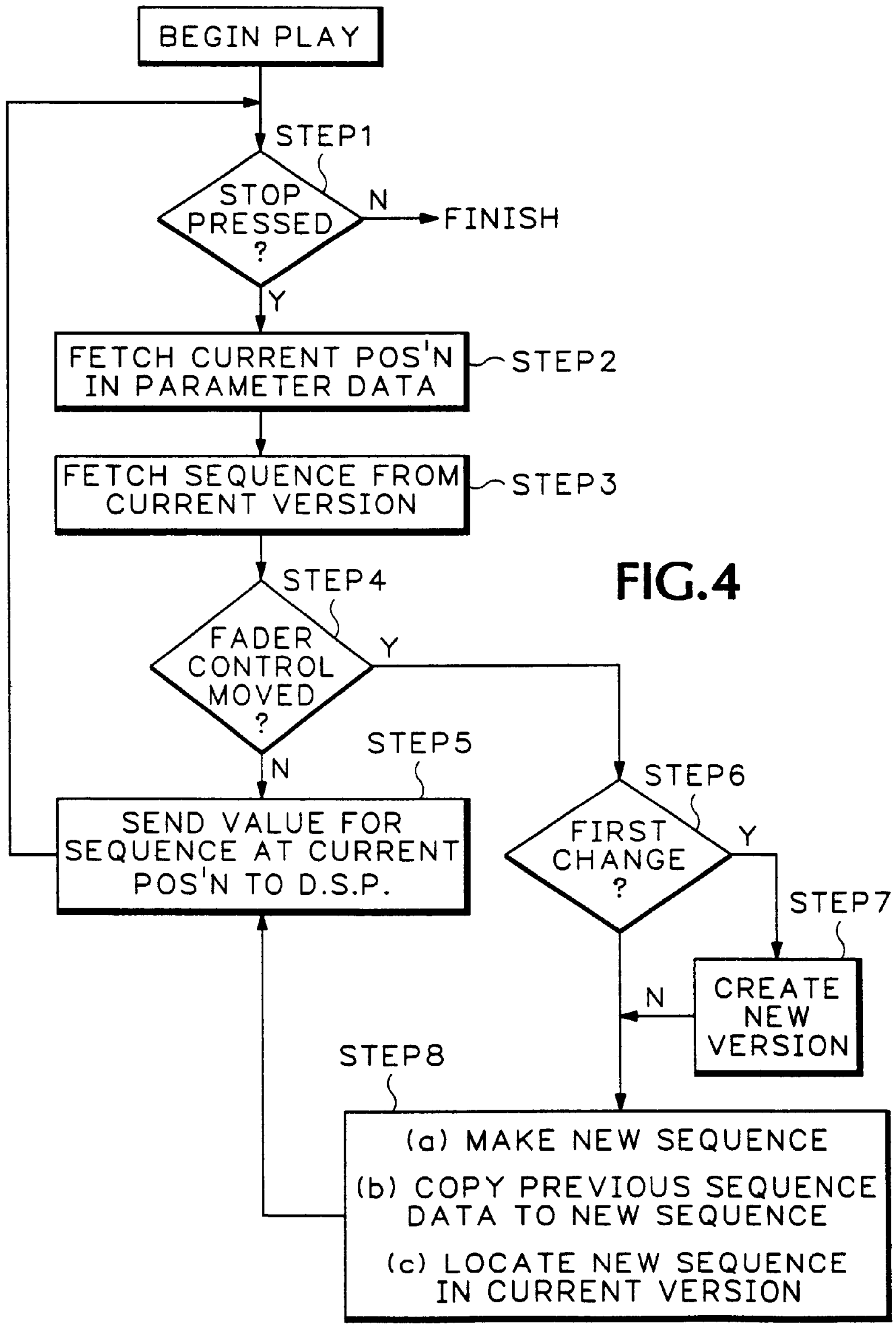
FIG. 4 shows a flow diagram of the system and method in accordance with this invention.

The above operation will now be described in greater detail with reference to FIGS. 3 and 4.

Referring to FIG. 3, the control parameter, i.e. the location of the fader slider 11 is broken up into sequences of data each of block size 4096 bytes. In FIGS. 3(*a*) and 3(*b*), four sequences are shown each of 4096 bytes with the sequence parameter control data being shown in FIG. 3(*a*) and the associated sequence identifier code being numerics 1, 2, 3, 4 respectively shown in FIG. 3(*b*). The stored data is of the sequence identifier code so that the original control parameters for the fader control 1 (version 1) are 1, 2, 3, 4(as shown in FIG. 3(*b*)).

If now the audio engineer upon replaying the audio track decides to move the slider control 11 in the sequence identified by identifier code 2, i.e. the second block of data, to produce a sequence of positional data for that modified (second) position shown in FIG. 3(*c*) then on that modified version 2 the block sequence identifier code is 1, 5, 3, 4 as shown in FIG. 3(*d*). Thus the sequence of positional data has changed from version 1, shown in the combined form of FIG. 3(*e*), to the version 2 shown in FIG. 3(*f*).

It will therefore be understood that the sequence identified by code 2 is used only in version 1 and the sequence identified by the code 5 is used only in version 2, with sequences identified by the codes 1, 3 and 4 being shared between versions 1 and 2. However it is only necessary to store the identifier codes 1, 3 and 4 once since they are shared between the two versions and the identifier code 2 for version 1 and the identifier code 5 for version 5.

The flow chart will now be described with reference to FIG. 4 where at each time "play" begins, it is determined at step 1 if the control 11 is pressed to stop the audio signal. If "yes", the current position of the control data is measured in value samples in step 2. Thus if for example a sampling rate of 50 Hz is used then after one minute, forty seconds, of sampling, the sample would be number 5000. Thus if the slider control is pressed by an audio engineer, the sampling is stopped and the sequence identifier code for the current position is determined. Thus with a block size of 4096 bytes and at a sample position of 5000 the sequence identity code is equal to the sample number divided by the block size. From such a calculation it is determined that the sequence identity code is equal to 2 remainder 904 (the block offset) at step 3. The sequence (control data parameter representative of the fader slider position) associated with the sequence identifier code is read. If the audio engineer has not changed the sequence (indicated by a different position of the control 11) the original sequence (step 4) control parameter value is written to the DSP 23 at step 5 and the cycle repeated.

If however the fader slider control position has moved at step 4 then it is determined at step 6 if it is the first positional change during replay of version 1, i.e. the same playthrough. If at step 6 it is decided that it is the first change then a new version is created at step 7. At step 8, a new sequence, i.e. block of data, is written, the old block of data of version 1 up to the new sequence is copied and the new sequence is put into the current version. Thus in the example of FIG. 3, version 2 is created by copying original version sequence 1, but with new sequence 5 substituting version 1, sequence 2.

The flow then steps to step 5.

If at step 6 it is determined that it is not the first change during the same playthrough and a new version has already been created then the flow moves to step 8. Therefore version 2 is created by copying original version 1 sequences 1, 3, 4 and substituting new version 2 sequence 5 for version 1 sequence 2.

At both steps 5 and 8, the data block offset is determined from the sample position (mod data block size), i.e. equals remainder of 5000 ö 4096 which block offset is written to the DSP.

Thus with the present invention a new version is made by copying the current version and writing a new block of data for a particular block that is altered into the version that is being played. A table of different versions will therefore be built up, any of which may be replayed and further modified.

The present invention therefore has the ability to "undo" a previous modification and is able to "redo" a previously modified version by appropriate selection of the version to be played.

It is currently envisaged that because it is only a numeric code identifier that is being stored for each sequence so the code identifiers for each sequence in a version will be stored. However it is envisaged that instead of storing the actual modified sequence it is the change in sequence (i.e. the Δ sequence) that is stored. In another embodiment it is envisaged that instead of storing the code identifier for each sequence of a version, it is only the modified sequence that is stored for a subsequent version but in such a situation the user will have to identify which of the previous versions is to be associated with such a modified sequence.

What is claimed is:

1. An audio control method comprising the steps of:

storing a control parameter for an audio signal in the form of a plurality of sequences of data, each sequence having a unique identification code with a series of the unique identification codes associated with the sequences defining an original version of the audio signal;

modifying the control parameter at a selected one of the sequences to produce a new sequence with a new unique identification code, the new sequence being stored with the plurality of sequences; and creating a new version of the audio signal with the new unique identification code in lieu of the unique identification code for the sequence that was modified while retaining the original version.

2. An audio control system comprising:

means for storing a control parameter for an audio signal in the form of a plurality of sequences of data, each sequence having a unique identification code with a series of the unique identification codes associated with the sequences defining an original version of the audio signal;

means for modifying the control parameter at a selected one of the sequences to produce a new sequence with a new unique identification code, the new sequence being stored with the plurality of sequences; and means for creating a new version of the audio signal with the new unique identification code in lieu of the unique identification code for the sequence that was modified while retaining the original version.

* * * * *